(12) United States Patent
Bangert

(10) Patent No.: US 6,873,055 B2
(45) Date of Patent: Mar. 29, 2005

(54) INTEGRATED CIRCUIT ARRANGEMENT WITH FIELD-SHAPING ELECTRICAL CONDUCTOR

(75) Inventor: Joachim Bangert, Erlangen (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 09/948,263

(22) Filed: Sep. 6, 2001

(65) Prior Publication Data

US 2002/0074575 A1 Jun. 20, 2002

(30) Foreign Application Priority Data

Sep. 6, 2000 (DE) .......................................... 100 43 947

(51) Int. Cl.$^7$ .......................... G11C 11/14; H01L 29/94; H01L 31/062

(52) U.S. Cl. ...................... 257/775; 257/211; 257/208; 257/209; 257/421; 257/776; 257/773; 257/326; 257/661; 257/62; 257/295; 257/659; 257/390; 257/758; 257/775

(58) Field of Search ................................ 257/775, 211, 257/208, 209, 421, 776, 773, 326, 661, 62, 295, 659, 390, 758

(56) References Cited

U.S. PATENT DOCUMENTS

| | | | | |
|---|---|---|---|---|
| 6,153,443 A | * | 11/2000 | Durlam et al. ................. | 438/3 |
| 6,165,803 A | * | 12/2000 | Chen et al. ..................... | 438/3 |
| 6,242,770 B1 | * | 6/2001 | Bronner et al. .............. | 257/295 |
| 6,413,788 B1 | * | 7/2002 | Tuttle ............................. | 438/3 |
| 6,518,609 B1 | * | 2/2003 | Ramesh ...................... | 257/295 |
| 2002/0015035 A1 | * | 2/2002 | Sandhu et al. .............. | 257/375 |
| 2002/0127743 A1 | * | 9/2002 | Nickel et al. .................. | 438/3 |
| 2002/0132375 A1 | * | 9/2002 | Doan et al. ................... | 438/3 |
| 2002/0182755 A1 | * | 12/2002 | Lee ................................ | 438/3 |
| 2002/0186583 A1 | * | 12/2002 | Tuttle ......................... | 365/171 |

FOREIGN PATENT DOCUMENTS

| | | |
|---|---|---|
| DE | 40 31 560 A 1 | 4/1992 |
| DE | 198 36 567 A 1 | 2/2000 |

OTHER PUBLICATIONS

"Magnetic Sensors Continue to Advance Towards Perfection" (Roumenin), Sensors and Actuators A 46–47 (1995), pp. 273–279.

* cited by examiner

Primary Examiner—Alexander Oscar Williams
(74) Attorney, Agent, or Firm—Laurence A. Greenberg; Werner H. Stemer; Gregory L. Mayback

(57) ABSTRACT

An integrated circuit arrangement includes at least one electrical conductor that, when a current flows through it, produces a magnetic field that acts on at least a further part of the circuit configuration, wherein seen in cross-section, the electrical conductor has at least one recess or depression, or a region of reduced conductivity on the side facing that part, in order to influence the magnetic field that can be produced.

13 Claims, 7 Drawing Sheets

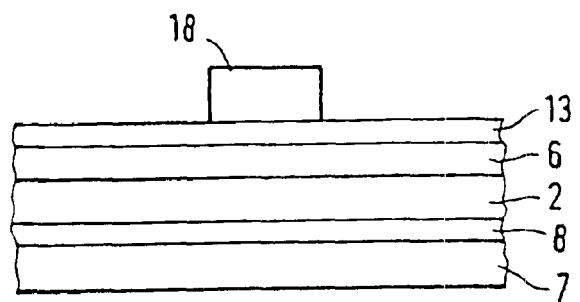
FIG. 4A
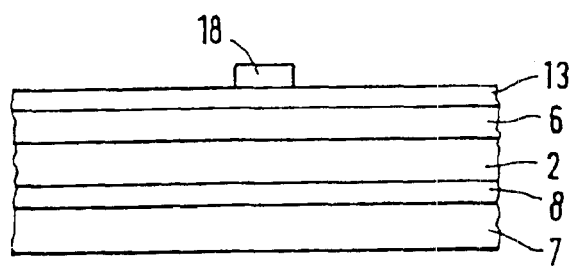
FIG. 4B
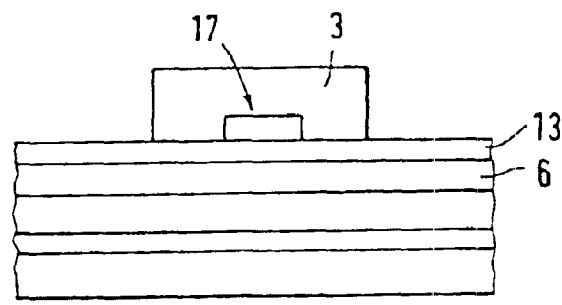
FIG. 4C
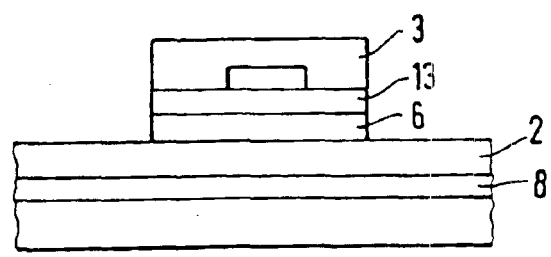
FIG. 4D
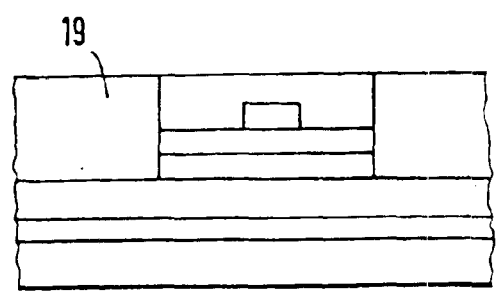
FIG. 4E
FIG. 4

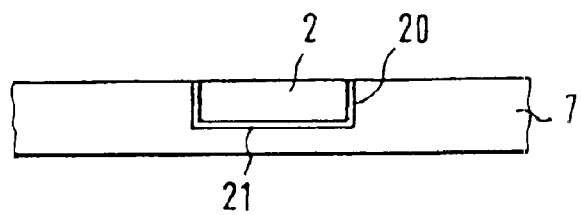
FIG. 5A
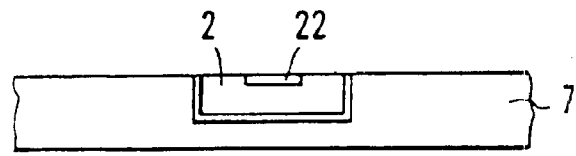
FIG. 5B
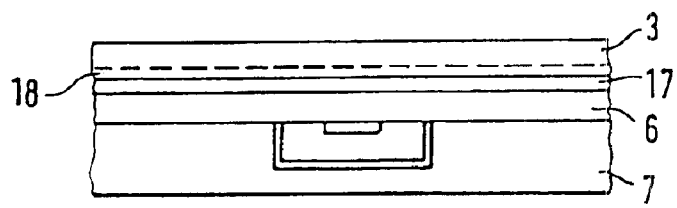
FIG. 5C
FIG. 5
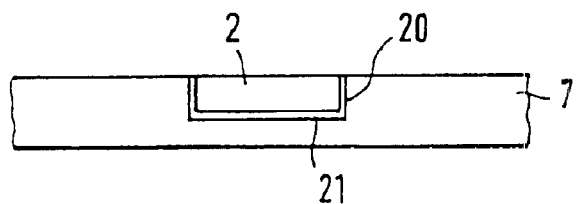
FIG. 6A
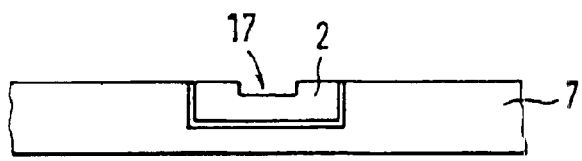
FIG. 6B
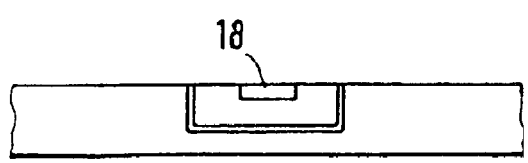
FIG. 6C
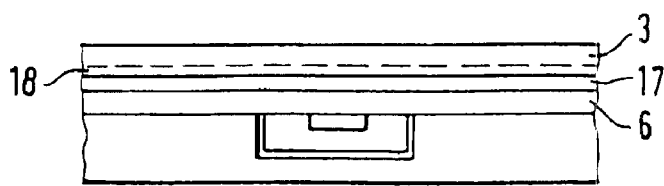
FIG. 6D
FIG. 6

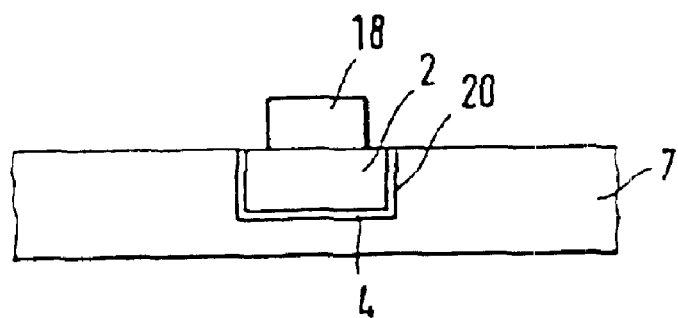
FIG. 7A
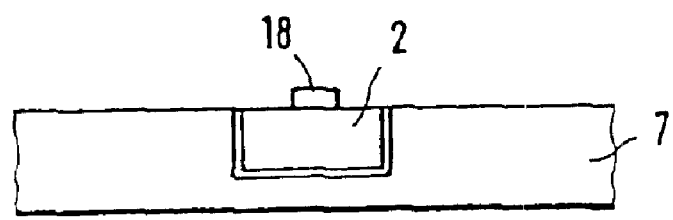
FIG. 7B
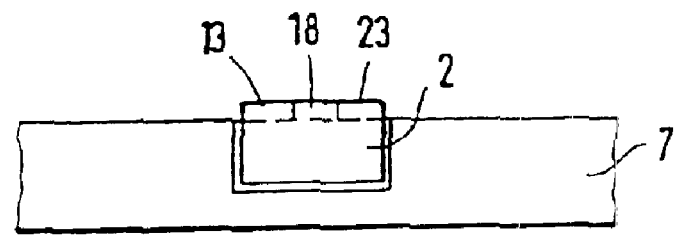
FIG. 7C
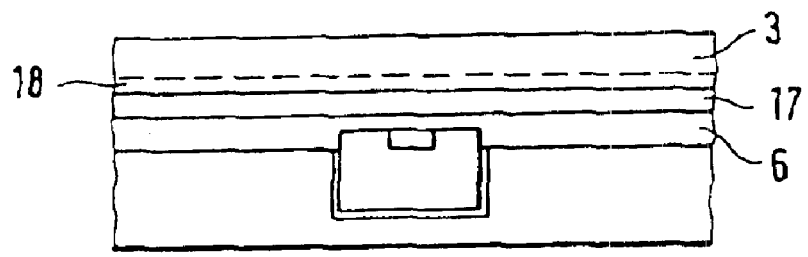
FIG. 7D
FIG. 7

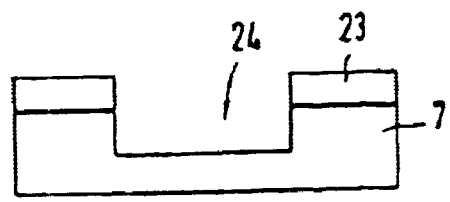
FIG.8A
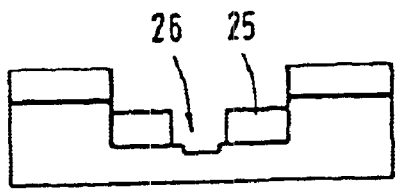
FIG.8B
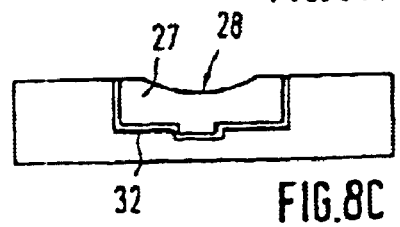
FIG.8C
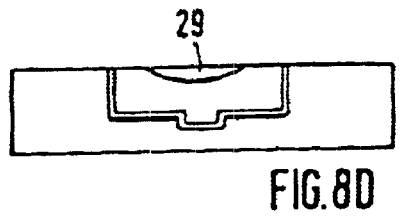
FIG.8D
FIG.8
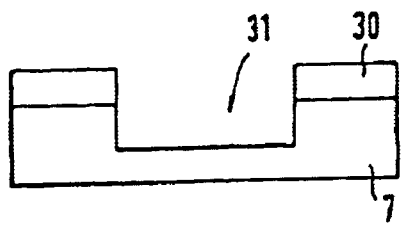
FIG.9A
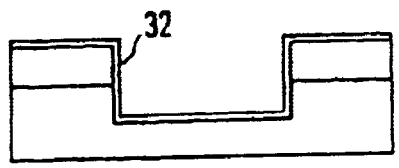
FIG.9B
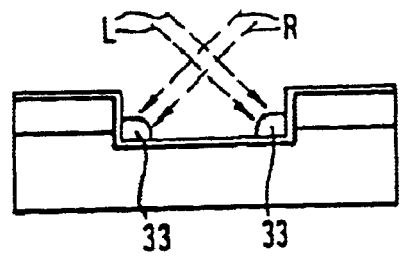
FIG.9C
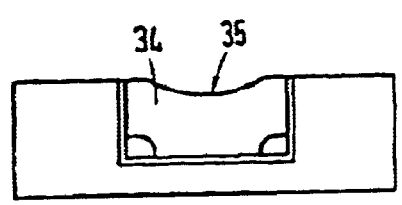
FIG.9D
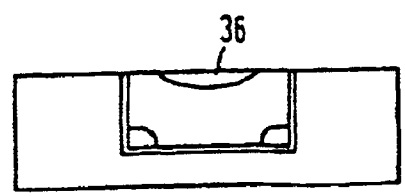
FIG.9E
FIG.9

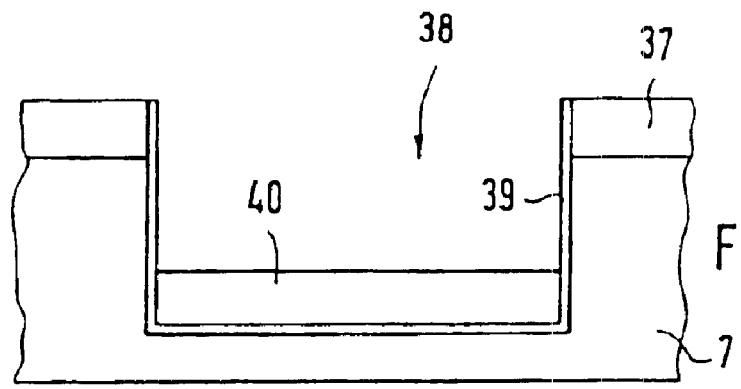
FIG. 10A
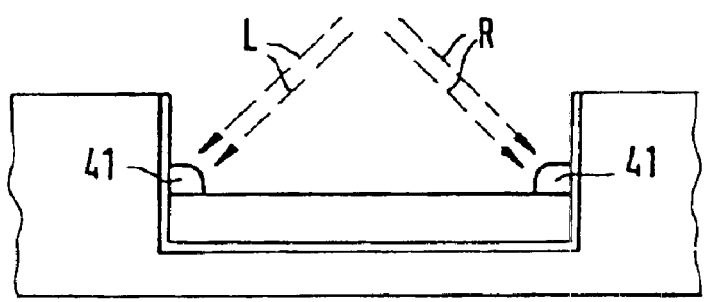
FIG. 10B
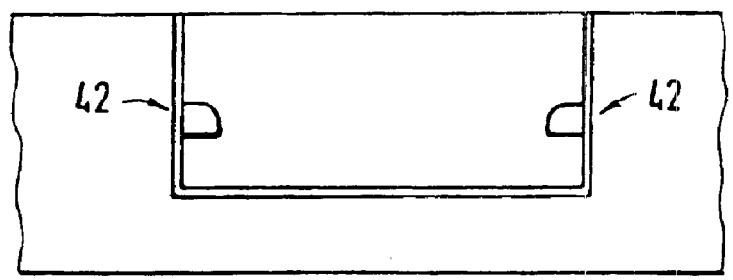
FIG. 10C
FIG. 10

INTEGRATED CIRCUIT ARRANGEMENT WITH FIELD-SHAPING ELECTRICAL CONDUCTOR

BACKGROUND OF THE INVENTION

Field of the Invention

The invention relates to an integrated circuit arrangement having at least one electrical conductor, which, when current flows through it, produces a magnetic field which acts on at least one further part of the circuit arrangement.

Integrated circuit arrangements of this type are known, for example, in the form of magnetocouplers or current sensors. An electrical conductor through which a current flows is provided in these devices. As is known, a conductor through which a current is flowing produces a magnetic field which is picked up in the circuit arrangement by means of the further part, which is formed there as a measurement element for measuring the magnetic field. The magnitude of the current which is flowing can be detected from the magnitude of the measured value obtained.

One integrated circuit arrangement that has been developed relatively recently is the magnetic (random access memory) RAM memory cell (MRAM). MRAMs are used for storing large amounts of data, and represent an alternative to conventional semiconductor memories. In a circuit arrangement such as this, electrical conductors are provided arranged in two planes and running essentially at right angles to one another. A further part is provided at each crossing point between the electrical conductors, and this part is in the form of a layer system which forms the actual memory unit. The functional principle is based on two magnetic layers being provided within this layer system, with the magnetization of one layer (reference layer) being fixed, while the magnetization of the second layer (memory layer) can be rotated between at least two positions in response to an external magnetic field. Depending on the position of this magnetization of the memory layer, the current flowing through this layer system changes in order to magnetize the reference layer. This is because the magnetization position is critical for the magnitude of the internal resistance of the arrangement.

The setting or changing of the magnetization of the memory layer is carried out such that each lower and each upper electrical conductor which cross at the crossing point where the layer system to be written to is located has half the current applied to it required to set the magnetization. It is possible by appropriate timing of the times at which the current is applied and switched off to produce a magnetic field, acting on the magnetization, of sufficient strength to allow the magnetization to be set. If the magnetization is already in the direction governed by the external field, then nothing changes, but if it is in the direction opposite to the magnetic field direction, then the magnetization is reversed. Once the external field has been switched off, the magnetization remains aligned in this way.

However, one problem is that the magnetic field produced by a conductor when current flows through is highly inhomogeneous. The field of an essentially rectangular conductor—since integrated circuit arrangements of this type are formed in thin layers, a conductor at the boundary surface to a subsequent layer has an essentially planar surface—is essentially bell-shaped, with the magnetic field admittedly falling toward the edge, but in the process being "smeared", that is to say having a considerable width. This means that the further part, which is a measurement system in most applications of an integrated circuit arrangement, but which, as stated, may also be a memory system, thus sees field regions of different intensity. Particularly in the case of the MRAM that have been referred to, this results in difficulties, since the magnetic field—in this case the magnetic field resulting from the superimposition of the two magnetic fields from the upper and lower electrical conductors—is intended to be used to switch the entire magnetization of the memory layer, which has a single domain and must be prevented from breaking down into a number of domains. Another disadvantage is that, if there is any misalignment, that is to say if a memory layer or measurement system is not exactly underneath an electrical conductor but is slightly offset with respect to it, the reduction in the field moving away from the curve maxima means that switching is no longer necessarily guaranteed, and breakdown into a number of domains is possible.

In order to produce a more homogeneous magnetic field, it is feasible to increase the distance between the electrical conductors and the magnetic memory layer so that the field is broadened on the memory layer. However, this is not practicable, since, firstly, currents well above the maximum permissible current density would be required to achieve the switching field strengths. Furthermore, an additional contact would have to be provided, for reading the information. Finally, the distance between the memory layers would also have to be increased, in order to avoid influencing adjacent memory layers. As an alternative to this, it is feasible to broaden the electrical conductors until the memory layer is smaller than the electrical conductor track width (ratio, for example, 1:10). However, this is likewise impracticable, since it is then impossible to choose the packing density to be sufficiently high, with a very high packing density being a considerable advantage of an MRAM over conventional silicon memories.

SUMMARY OF THE INVENTION

The invention is thus based on the problem of specifying a circuit arrangement which allows the production of a more homogeneous magnetic field.

According to the invention and in the case of an integrated circuit arrangement of the type mentioned initially, this problem is solved in that seen in cross section, the electrical conductor has at least one recess or depression, or a region of reduced conductivity on the side facing that part, in order to influence the magnetic field which can be produced.

The invention is based on the knowledge that the shape of the magnetic field produced by a conductor through which current is flowing is dependent on the conductor geometry. The invention now proposes that the geometry of the conductor cross section be varied, by means of the recess or the depression of a nonconductive region on the side facing that part, in order in this way to influence the field profile, primarily for homogenization. The invention provides for the variation of the effective conductor geometry in a specific region, and hence for the region within which the current is transported to be varied. In consequence, it is possible to design the magnetic field which is formed over the conductor side facing that part, namely as a function of how the conductor shape or geometry appears as a result of the recess, etc. This offers the capability effectively to flatten and smooth out the region around the curve maxima resulting over such a flat face with the known bell-shaped field, so that the further part sees a considerably more homogeneous field. Equally, the opposite effect of field concentration can also be achieved if two recesses are provided at the side, so that a projection remains in the center. The expressions "recess" or "depression" or "region of reduced conductivity" should be regarded as meaning any surface change which makes the ideally planar conductor surface non planar, or gives it a non-planar current conduction profile. Steps or even curved shapes can be created by means of the recess, the depression or that region.

The invention can be used equally well in a circuit arrangement having an electrical conductor and a further part adjacent to it, as is provided, for example, in a current sensor or magnetocoupler. Furthermore, as stated, it can also be used in a circuit arrangement in the form of an MRAM, in which a number of electrical conductors which lie in two planes and cross essentially at right angles are provided, between which a further part is held at in each case one crossing point. In this embodiment of the circuit arrangement, only one of the electrical conductors which cross at a crossing point may have a recess or depression or a region of reduced conductivity. For manufacturing reasons, it is easier to form the upper electrical conductor, which will be produced later, in a corresponding manner. It is, of course, possible to vary the effective conductor geometry in places on both of the electrical conductors which cross at a crossing point, and thus to influence both individual magnetic fields, in particular to homogenize them. A further possible application is magnetic logic, whose basic cells are intended to be designed in a similar way to MRAM memory cells or sensors.

According to the invention, the recess, the depression or the region may extend over a major proportion of the length of the electrical conductor or conductors. Alternatively to this, the geometry change may also be provided only essentially at points in the region of the crossing points on the electrical conductor or both electrical conductors.

According to the described first invention alternative, the geometric design of the conductor can be produced by providing a recess or a depression on that side of the electrical conductor which faces the further part. Thus, in this embodiment, the thickness reduction is achieved by varying the surface structure or the shape of the electrical conductor. In this case, the recess or depression may have an essentially rectangular cross section, provided this is possible in a defined manner in the small structures which are in the region of a few nanometers. Thus, approximately three regions are in this case produced over the conductor width, namely the two edge regions where the diameter is larger, and the central region where the diameter is smaller. One alternative to this provides for the recess or depression to have an essentially concave cross section. In this case, the diameter increases continuously from a minimum of the center toward the edges of the conductor, based on the assumption of an ideal rectangular conductor.

The recess or depression is expediently filled with a nonconductive material, with this material being dependent on the production technique—which will be described later on—either on the basis of its shape in order to form the depression itself, or else for subsequent filling, in order to homogenize the surface.

For the most general configuration, a nonconductive varnish is expediently used as the material. This can easily be applied, shaped and processed photolithographically, and this technique is sufficiently convenient. As an alternative to this, it is possible to use a comparatively high-resistance material (copper or aluminum for the conductor material), in particular the high-resistance phase of tantalum. Other insulating materials can be used in the process, such as $Al_2O_3$, SiOx, SiNx and combinations of them. A nonconductive magnetic material can also be used for the side on which the reference layer is located for the application in an MRAM memory cell, which magnetic material is either available in the arrangement or—sensibly—supports the characteristics of the reference layer. In this case, for example, NiO is very highly suitable as an antiferromagnet with thicknesses of not less than about 10 nm.

In addition to the formation of a recess or depression, it is just as expedient, as described, to provide a region of reduced conductivity in order to reduce the conductor thickness on the side of the electrical conductor opposite that part. This region of reduced conductivity carries no current in just the same way as the region of the recess or depression. This is because the current flows in the rest of the conductor region, where it has a low resistance, or higher conductivity. This region of reduced conductivity, or the region of increased resistance, can be produced either by ion bombardment, for example by means of Fe ions, or by diffusion of at least one element, for example Si.

With respect to the exact coverage of an electrical conductor and of a further part, as occurs in the ideal case—in particular in the case of an MRAM—it is expedient for the region of the recess or depression, of the region of reduced conductivity, to be provided essentially centrally on the electrical conductor, with respect to its width.

In order to allow the field flanks to fall away as quickly as possible (in three dimensions) in addition to the homogenization of the magnetic field, in order to reduce the width of the field—which is already somewhat narrower owing to the thickness change described above—it is advantageous for recesses or depressions or regions of reduced conductivity to be provided to reduce the thickness, at the edges, on the opposite side of the electrical conductor, owing to be arranged alongside the first section where the conductor thickness is reduced, but on the opposite side, as described. This can be produced in the same way as that described above, that is to say by means of "real" recesses by shape changing, by structuring or else by producing regions of high resistance.

In addition to the integrated circuit arrangement itself, the invention also relates to a first method for producing an integrated circuit arrangement having one or more electrical conductors lying in a plane, in which method the following steps are carried out once the further part has been produced in the form of a layer which can be influenced by a magnetic field, for example in the form of a layer system:

production of a layer of nonconductive material corresponding to the position of an electrical conductor to be produced subsequently, reduction in the thickness and/or width of the material layer, application of an electrical conductor covering the material layer.

In this method refinement, the reduction in the diameter of the electrical conductor is achieved by prior production and dimensioning of the material layer over which the electrical conductor material is then coated. A varnish which is exposed and developed before reduction may be used as the material. For the reduction process itself, the varnish can be incinerated, in which case it should be stressed that, in entirely general form, any possible means known from photolithography can be used for varnish removal or varnish thickness and width reduction.

As an alternative to the use of varnish, a nonconductive metal, in particular the high-resistance phase of tantalum, can be used as the material, with the metal in this case being etched for reduction, or with other known options being used (for example electron beam coating of the critical points or other direct high-resolution lithography methods).

A second method alternative for producing an integrated circuit arrangement having one or more electrical conductors lying in a plane provides for the following steps to be carried out before production of the further part in the form of a layer which can be influenced by a magnetic field:

production of one or more electrical conductors on a substrate, production of a region of reduced conductivity on the free side of an electrical conductor for reduction of the conductor thickness which is relevant for the formation of a magnetic field when current flows, after which the variable layer is produced on an electrical conductor.

With regard to the production of an MRAM, the method variant described above allows the structuring of the upper electrical conductor, that is to say of the electrical conductor which will be deposited at a later time, while the present method variant allows the formation of the lower electrical conductor, which will be produced first of all, in the sense according to the invention. The conductivity change is in this case produced by ion bombardment, or alternatively by diffusion into the electrical conductor of at least one element (or molecule) which reduces the conductivity.

If the circuit arrangement to be produced according to the method is in the form of a magnetocoupler, current sensor or the like, that is to say while there is only one electrical conductor in the plane, there is no need to form a second electrical conductor or a second electrical conductor plane.

However, in the situation where an MRAM is being produced with electrical conductors located in two planes, a second electrical conductor plane must be produced in the case of the second method variant, and this is produced after production of the variable layer, or the layer which can be influenced. This electrical conductor need not necessarily be structured in the sense according to the invention. However, it is expedient if the electrical conductors which are located above the layer which can be influenced once said layer has been produced are likewise structured, preferably using the method described above.

A further method variant relating to the formation according to the invention of a buried electrical conductor located at the bottom provides for the production of the further part in the form of a layer which can be varied or influenced by a magnetic field and having the following steps:

production of one or more electrical conductors on a substrate, production of a recess or a depression on the free side of an electrical conductor for reduction of the conductor thickness which is relevant for the formation of a magnetic field when current flows, introduction of a nonconductive material into the recess or depression after which the variable layer is produced on an electrical conductor.

Thus, in this refinement, a recess or depression is produced for structuring or shaping in the top face of the electrical conductor that is produced, preferably using a sputtering method, and it is then filled with nonconductive material in order to form a planar surface for the subsequent growth of the variable layer or layer system. Once again, a varnish or alternatively a nonconductive metal may be used as the material here. In this case as well, it is possible in the case of an MRAM for the subsequently produced electrical conductors in the second plane also to be structured using the method described initially.

Finally, a third method is provided for producing a circuit arrangement, in which method the following steps are carried out before the production of the layer which can be influenced:

production of one or more electrical conductors on a substrate, production of a layer of nonconductive material on an electrical conductor, reduction of the thickness and/or width of the material layer, production of further sections, which surround the remaining material layer at the side, of the electrical conductor, to form an electrical conductor having a relevant conductor thickness which is reduced for the formation of a magnetic field when current flows, after which the variable layer is produced on an electrical conductor.

Thus, in this embodiment, the electrical conductor is itself formed in a number of steps. First of all, a first electrical conductor layer is deposited, and the nonconductive material layer is then applied and dimensioned, after which two further electrical conductor layers are deposited at the side, so that recesses or depressions are also formed on the electrical conductors here. In this case as well, a varnish or a nonconductive metal may once again be used. In this case as well, the corresponding formation of the electrical conductors which are to be produced subsequently in the second plane for an MRAM is expedient.

Further expedient method alternatives can be found in the further independent patent claims and in their dependent claims.

It should be mentioned, of course, that each electrical conductor is provided in a corresponding manner with recesses, depressions or regions of reduced conductivity, where there are a number of electrical conductors on the respective circuit arrangement.

Overall, the present invention makes it possible to homogenize a field produced by a conductor through which a current is flowing, for example a write field in the case of an MRAM, without any major technological complexity. The packing density is not influenced in the process. In the case of an MRAM, the process of reading a cell is not influenced either, since there is still metallic material above the barrier formed by the recess or the region of increased conductivity, and this represents an equipotential surface, which has a high resistance for the current flow in the layer plane.

Further advantages, features and details of the invention will become evident from the exemplary embodiments described in the following text and from the drawings.

BRIEF DESCRIPTION OF THE DRAWINGS

FIG. 4 shows outline sketches to illustrate the production of a structured electrical conductor according to a first method, FIG. 5 shows outline sketches to illustrate the production of a structured electrical conductor according to a second method, FIG. 6 shows outline sketches to illustrate the production of a structured electrical conductor according to a third method, FIG. 7 shows outline sketches to illustrate the production of a structured electrical conductor according to a fourth method, FIG. 8 shows outline sketches to illustrate the production of a structured electrical conductor according to a fifth method, FIG. 9 shows outline sketches to illustrate the production of a structured electrical conductor according to a sixth method, and FIG. 10 shows outline sketches to illustrate the production of a structured electrical conductor according to a seventh method.

DESCRIPTION OF THE PREFERRED EMBODIMENTS

Figure 1:
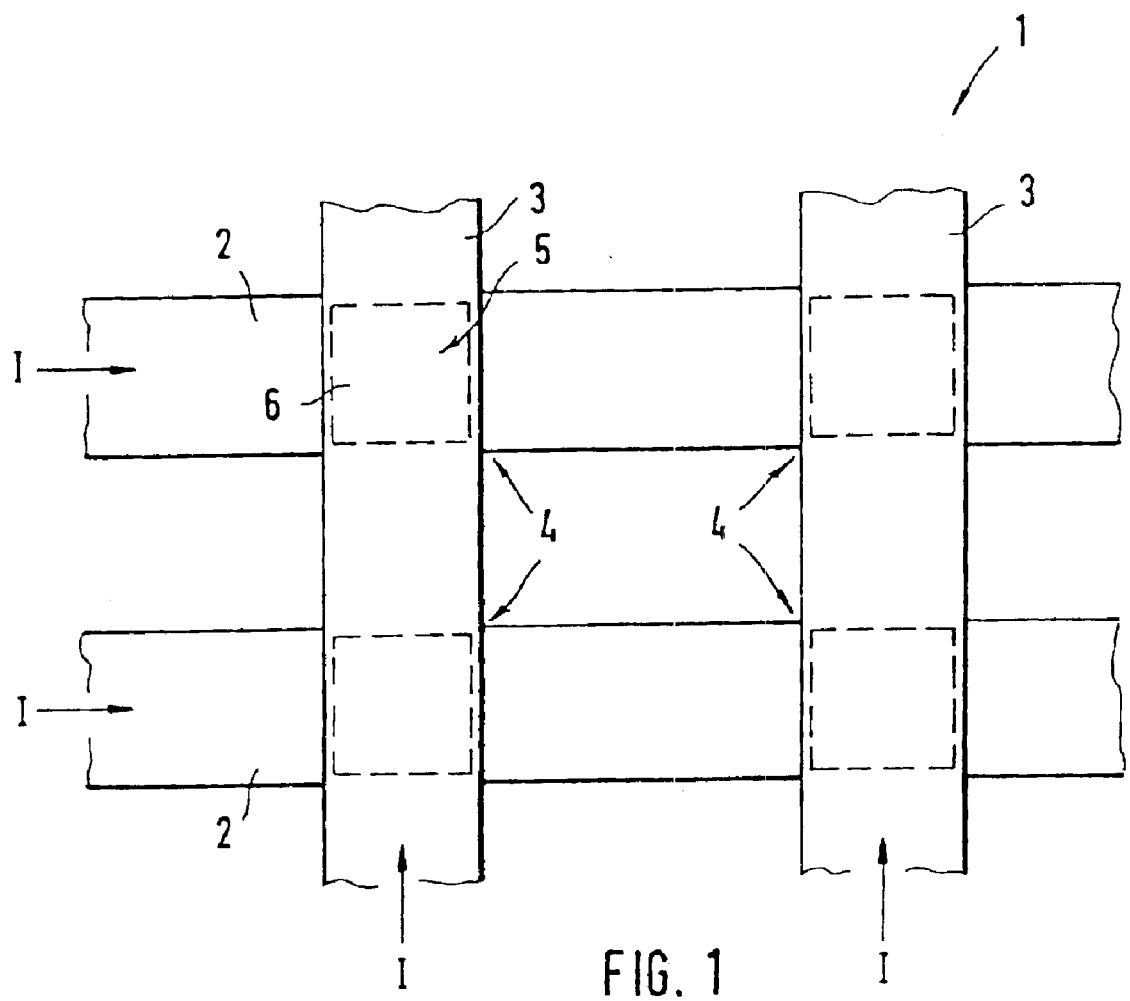
FIG. 1 shows an outline sketch of the electrical conductor routing in an MRAM.

FIG. 1 shows, in the form of an outline sketch, a circuit arrangement 1 which is formed on a substrate that is not shown in any more detail. This circuit arrangement 1 has first electrical conductors 2, which run parallel to one another in a first, lower plane, and second electrical conductors 3, which likewise run parallel to one another, in a second plane located above the first. The electrical conductors 2 and 3 themselves run at right angles to one another. A further part 5 in the form of a magnetic layer system 6 is arranged at each of the crossing points 4 between the electrical conductors 2, 3, and these are shown by rectangles in the outline sketch, but in practice are round or lens-shaped, which is advantageous from the point of view that the magnetization change takes place very quickly, since the magnetization can rotate more easily. This layer system 6 can have a magnetic field applied to it, produced by the electrical conductors 2, 3 through which the current flows. For this purpose, current can be passed through the electrical conductors 2, 3 as indicated by the arrows I. An MRAM such as that shown in FIG. 1 is now operated by passing through each electrical conductor half the current required to switch the memory layer magnetization (this will be described in more detail in the following text, with reference to FIG. 2). The conductors 2, 3 through which current is passed meet at a specific crossing point 4, where the two magnetic fields, each of which is produced by half the current, are superimposed on one another so that, overall, the layer system 6 has a sufficiently high magnetic field applied to it to allow the memory layer magnetization to switch. This remagnetization takes place by means of a process of rotating the magnetization, and for which reason it depends on the specific timing when the individual currents are switched on, and thus on the production of the individual magnetic fields, which are aligned in a direction at right angles to one another. The fundamental principle of operation of an MRAM is sufficiently well known, and therefore need not be described in any more detail here.

This has the particular advantage that, furthermore, it avoids the difficulties resulting from the superimposition of two fields with clearly pronounced maxima. This is because, the pronounced field maxima resulting from unstructured conductors mean that the force vectors of the superimposed field which act on the magnetization of the memory layer are not very largely in uniform directions over the surface on which the field acts on the memory layer, but in some cases run at considerable angles to one another. The background to this is that the fields of the electrical conductors 2, 3 are at right angles to one another. The field superimposition with a sharply pronounced maximum means that the field is distributed uniformly only in the center of the surface on which the field acts, which means that the resultant force vector is at 45° to the two individual fields. Away from the center, the respective field magnitude relating to the resultant force vector is of different size, which means that the respective force vector is slightly tilted from the 45° position. This tilt angle is several degrees. This now results not only in the entire field strength being inhomogeneous over the area on which it acts, but also in inhomogeneity of the direction in which the write field acts on the magnetization of the memory layer. In the worst case, this can lead to the magnetization of the memory layer being able to break down into individual domains.

If, on the other hand, two individual fields (which are homogeneous over a large area of the surface on which they act and are superimposed) are superimposed, then, firstly, the field strength is as homogeneous as possible over the area of coverage, that is to say the area of the memory layer system to which the superimposed field is applied, and, furthermore, the force direction is also largely the same.

Figure 2:
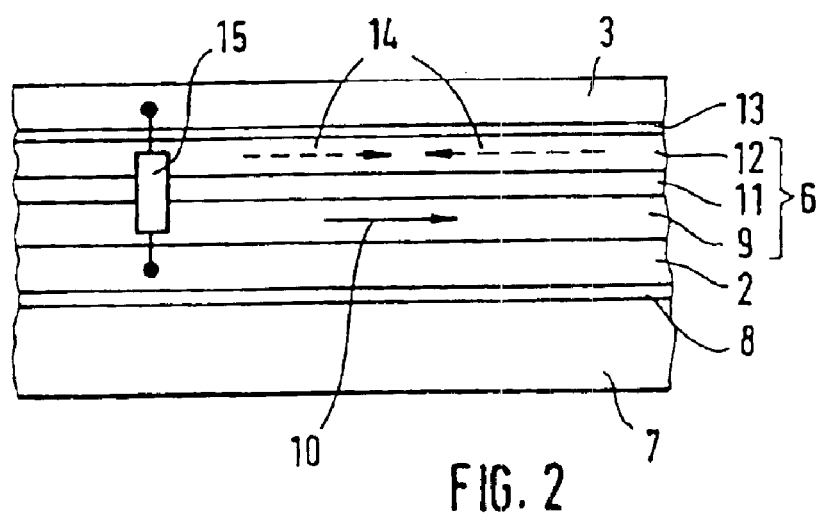
FIG. 2 shows a section through a crossing point in the configuration shown in FIG. 1.

FIG. 2 shows a section through a crossing point, in the form of an outline sketch. The figure shows a smooth background, for example the substrate 7, for which a silicon wafer is preferably used. Alternatively, a number of identical MRAM cell arrangements can be arranged in layers one above the other. The first lower electrical conductor 2 is applied to this substrate, with a diffusion barrier 13 and with the interposition of an insulation layer 8 (for example $SiO_2$). The memory layer system 6 is applied to this, as a thin-film multilayer structure. A reference layer 9 is deposited first of all. The reference layer 9 has permanent magnetization 10, which is aligned in a first direction. The reference layer is itself composed of a thin-film multilayer structure having a first layer of Co—Fe, a layer of Ru and a layer of Co—Fe, with the layer thicknesses being in the order of magnitude of about one nanometer.

A tunnel barrier layer 11, which is preferably a layer of $Al_2O_3$, is applied to the reference layer 9. The actual memory layer 12, which is preferably composed of Permaloy (NiFe 80:20), is then deposited onto this tunnel barrier layer 11. The layers 9, 11 and 12 form the layer system 6.

Finally, a diffusion barrier 13, preferably composed of TaS is deposited on the layer system 6, and this prevents undesirable elements from diffusing into the layer system 6, and adversely affecting it. The upper electrical conductor 3 is formed on top of this. The entire layer system 6 can also be applied in the opposite sequence, in the same way. The reference layer is then located above the barrier.

As can be seen, the memory layer 12 has magnetization 14, which can be aligned in one direction or the other, as indicated by the two dashed-line arrows pointing in opposite directions. This is done, as described, by passing an appropriate pulsed current through the electrical conductors 2 and 3. Once the magnetic field has been switched off, the magnetization 14 remains in the set direction. This may be either parallel to or in the opposite direction to the magnetization 10 of the reference layer, so that the internal resistance can be influenced via the illustrated structure, which is represented by the symbol 15. If the two magnetization directions are parallel, the internal resistance is low, but if they are in opposite directions to one another, the internal resistance is considerably higher. If a current is now passed through the illustrated structure, then the resultant signal changes depending on the magnetization position.

This means that it is possible to write information in the form of "0" and "1" to the MRAM memory cell shown in FIG. 2, and to read this information as required at a later time. The information remains stored.

Figure 3:
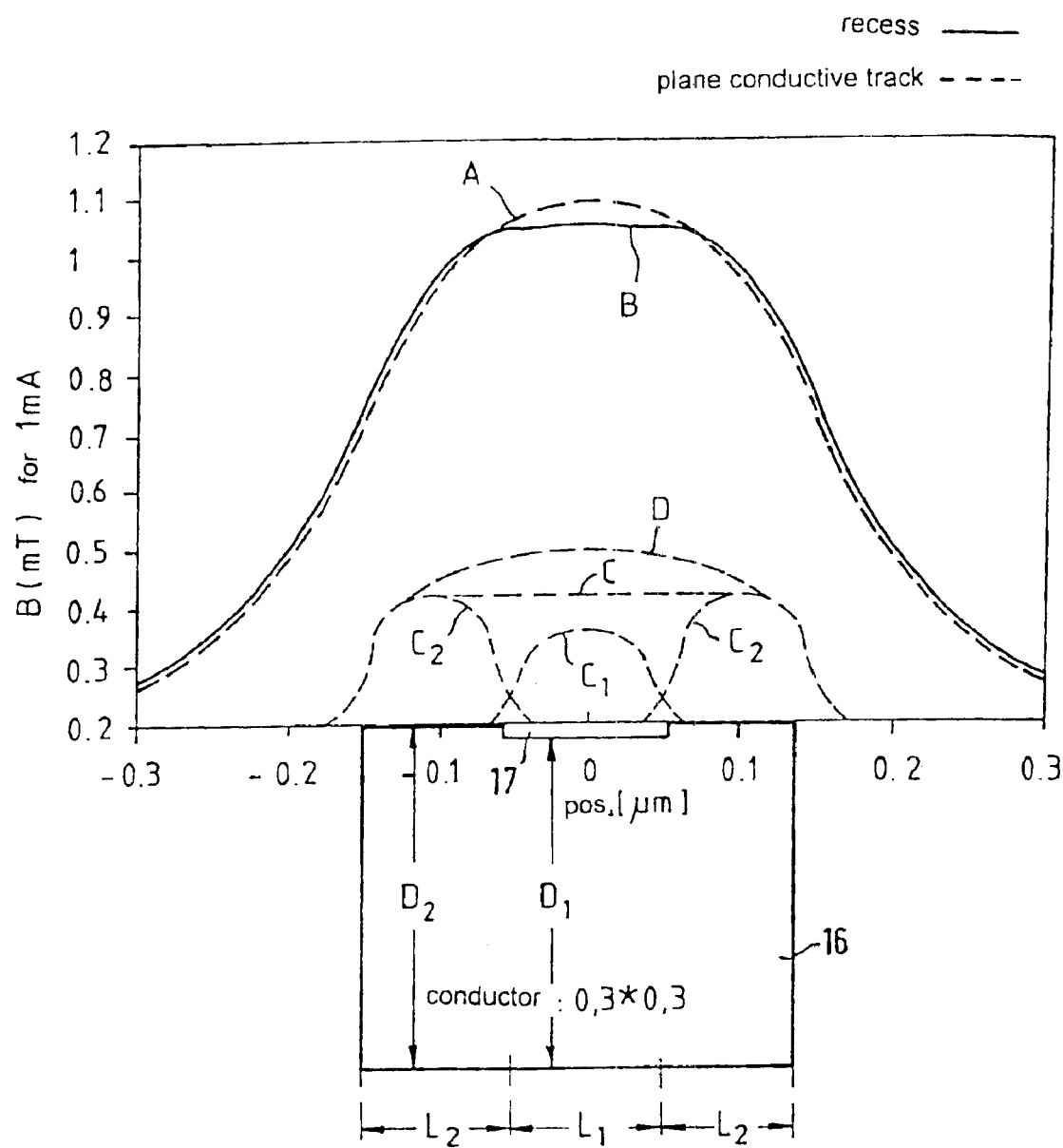
FIG. 3 shows an illustration of the magnetic field profile of an electrical conductor with and without structuring according to the invention.

The upper part of FIG. 3, shows, in the form of an outline sketch, the profile of the magnetic field of the electrical conductor shown underneath the diagram. The electrical conductor is essentially square, with a conductor cross section of, for example, 0.3×0.3 µm. A recess 17 which, in the illustrated example, has a width of 0.1 µm and a depth of 10 nm, is provided on the top of the electrical conductor 16. If current is now applied to the electrical conductor 16, a magnetic field is thus formed. The graph at the top shows the field profile for the electrical conductor 16 with and without the recess. The dashed curve A shows the profile without a recess. As can be seen, the curve A has a bell-shaped profile with a pronounced field maximum. In contrast, the solid curve B, which shows the profile with the recess, has a considerable flattened region, and the field is homogenized in the region of the maximum. This is achieved by the thickness being reduced by the recess. As shown in FIG. 3, the diameter in the section L1 is reduced to D1 by the recess, in comparison to the diameter D2 in the adjacent sections L2. Each of the sections L1 and L2 can be regarded approximately as a separate conductor, over which, as is shown separately and by dashed lines in FIG. 3, a specific magnetic field $C_1$, $C_2$ is formed. As can be seen, the magnetic field $C_1$ in the section L1 is somewhat weaker, since the shift in the current density center resulting from the diameter being reduced downward from the conductor center leads to a different current density distribution in the conductor. By superimposing the individual fields $C_1$, $C_2$ shown by dashed lines, which are approximations of those produced, to form the overall curve C, which is likewise illustrated by a dashed line, it can be seen that this makes it possible to flatten the current maximum. In contrast, the curve D shows the "total field" of the conductor without a recess.

If this is now transferred to the situation in the MRAM described above, this means that it is possible by appropriate shaping of the electrical conductors 2, 3 to influence the field profile deliberately, and to produce homogenization. In general, this means that it is possible to design the field profile by appropriate shaping of the electrical conductor cross section.

As a first method variant, FIG. 4 shows how such an upper electrical conductor, provided with a recess, can be produced. The illustrated example shows a substrate 7, the insulation layer 8 and the lower electrical conductor 2, on which the layer system 6 is once again provided and is covered by a diffusion barrier 13. Alternatively, the diffusion barrier 13 may also be arranged on the electrical conductor 2. In the first method step (FIG. 4A), a layer 18 composed of nonconductive material is applied to the diffusion barrier 13. This material may be, for example, a photoresist which can be deposited photolithographically (a positive or a negative resist may be used), or alternatively, it may also be a nonconductive metal which can be deposited, such as the high-resistance phase of tantalum or a nonconductive antiferromagnet ($NiO_2$ or the like).

In the next step (FIG. 4B), the width and thickness of the layer 18 are reduced to a predetermined extent, which can be done by suitable incineration of the varnish or, for example, by isotropically etching or sputtering back the applied metal. The remaining layer 18 is dimensioned to match the intended dimensions of the recess 17 shown in FIG. 3. The layer 18 is then (FIG. 4C) completely covered with the material of the upper electrical conductor 3. As can be seen, the presence of the layer 18 changes the cross section seen across the width of the conductor 3 (see FIG. 3). The diffusion barrier 13 and the layer system 6 are then etched away in the regions away from the conductor 3 in an etching process (FIG. 4D), after which, in the step shown in FIG. 4E, an insulation layer 19 (for example $SiO_2$) is applied.

FIG. 5 shows a second method variant for shaping the lower conductor according to the invention. First of all, an interconnect recess 20 is introduced into the substrate 7, and has an insulation layer 21 (for example $SiO_2$) internally. The conductor 2 is then introduced into this recess. CMP copper is generally preferably used as the conductor material. A region 22, which has considerably lower conductivity and hence a higher resistance than the rest of the conductor region, is then formed on the free side of the electrical conductor 2 by specific ion bombardment or a specific diffusion method. The layer system 6, the diffusion barrier 17 and the upper conductor 3 with the layer 18 that produces the recess are then formed on the configuration shown in FIG. 5B, using thin-film technology, as has been described with reference to FIG. 4.

In this refinement of the invention, both the lower and the upper conductor are thus structured according to the invention. In this case, it is possible to flatten and to homogenize the field maxima of both the fields produced by the upper and lower conductors.

Finally, FIG. 6 shows a further option for structuring of the lower conductor. In this case as well, a conductor recess 20 with internal insulation 21 is provided on the substrate 7. A recess 17 is now formed by sputtering (FIG. 6B) on the electrical conductor 2 that has been introduced, and a layer 18 of a varnish or of a nonconductive metal is introduced into this recess 17 (FIG. 6C). The layer system 6, the diffusion barrier 17 and the upper conductor 3, which is also structured with a layer 18, are then applied.

Finally, FIG. 7 shows a further production variant. The lower electrical conductor 2 is introduced onto a substrate 7 in a conductor recess 20 with insulation 21. A relatively large-area layer 18 (varnish or metal) is applied (FIG. 7A) to this, and is dimensioned (FIG. 7B) by removing material to achieve the desired size. In this case as well, the size of the layer 18 is critical to the size of the recess that is formed. Two sections 23 composed of a conductor material are then applied (FIG. 7C) on both sides along the material layer 18, holding the layer 18 between them. The heights of these two sections 23 are dimensioned such that the tops run as far as possible on the same level as the layer 18. Overall, a conductor with a recess according to the invention, or corresponding thickness structure, is thus also formed in this case. The layer system 6, the diffusion barrier 17 and the upper conductor 3 together with the varnish or metal layer 18 are then applied (FIG. 7D).

FIG. 8 shows a further method variant in the form of a number of outline illustrations. A varnish layer 23 is first of all applied to the substrate 7—which, as in all the exemplary embodiments, may be composed either of silicon or $SiO_2$— after which a first trench 24 is etched in the substrate (FIG. 8A). A varnish layer 25 is then deposited in the trench 24, allowing a further trench 26 to be etched (FIG. 8B). Thus, overall, this results in a stepped profile, in the form of trenches.

Once at least the varnish layer 25 has been removed (the varnish layer 23 may remain for further masking), the trenches 24, 26 are filled with the material 27 of the electrical conductor. The trench 26 is formed on the top face of the electrical conductor, in the form of the recess or depression 28 (FIG. 8C). This recess or depression 28 is then also filled with a material 29, for example a varnish. The further layer elements are then once again applied to this structure.

FIG. 9 shows a further method variant. Here, a trench 31 is first of all etched into a substrate 7 using a varnish layer for masking, after which—as in the case of the method variant shown in FIG. 8 as well—a diffusion barrier 32 is deposited in the trench. A projection 33 is then introduced into the trench edge by sputter-deposition in a directionally selective manner (as illustrated by the dashed-line arrows L, R). This is expediently done by sputter-deposition of an insulator such as $SiO_2$. The material 34 of the electrical conductor is then introduced, with the depression that remains between the projections 33 once again being marked off on the top face, forming a recess or a depression 35 on the top face of the conductor. This is then once again (see FIG. 9E) filled with a nonconductive material 36, for example a varnish. The further relevant layers and structures are then also applied to this structure.

FIG. 10 shows a final method variant. In this method variant, an electrical conductor is produced whose side surfaces have specially shaped surface structures. First of all, in step 10A, a trench 38 is etched into the substrate 7 using a varnish layer 37, after which a diffusion barrier 39 is applied. A first layer 40 composed of electrical conductor material is then introduced into the trench 38. Two projections 41 are once again incorporated in the longitudinal edge region on these layers by sputter-deposition in a directionally selective manner, see FIG. 10B (see the dashed-line arrows L, R there). Then, see step 10C, the rest of the trench is filled so that, overall, an electrical conductor is produced whose side walls are provided with the recesses or depressions. A further part, for example a Hall sensor, can be arranged opposite these side walls, with the magnetic field of the conductor through which the current flows acting on this further part. This magnetic field can be influenced and can be "tailor made" as described by structuring the surface of the respective side 42.

The illustrated exemplary embodiments do not form any restriction. Other method variants can also be used that allow the structuring of one or both electrical conductors in the sense according to the invention.

What is claimed is:

1. An integrated circuit arrangement having at least one electrical conductor which, when a current flows through it, produces a magnetic field which acts on at least a further part of the circuit arrangement, characterized in that, seen in cross section, the electrical conductor has at least one recess or depression, or a region of reduced conductivity on the side facing that part, in order to influence the magnetic field which can be produced.

2. The integrated circuit arrangement as claimed in claim 1, characterized in that an electrical conductor is provided, and a further part is provided, adjacent to it.

3. The integrated circuit arrangement as claimed in claim 1, characterized in that a number of electrical conductors are provided, which are located in two planes and cross essentially at right angles, between which a further part is held at in each case one crossing point.

4. The integrated circuit arrangement as claimed in claim 3, characterized in that only one of the electrical conductors which cross at a crossing point has a recess or depression or a region of reduced conductivity.

5. The integrated circuit arrangement as claimed in claim 3, characterized in that both of the electrical conductors which cross at a crossing point have a recess or depression, or a region of reduced conductivity.

6. The integrated circuit arrangement according to claim 1, characterized in that the recess or depression, or the region of reduced conductivity, of reduced conductor thickness, extends over a major portion of the length of the or a electrical conductor, or in that it is provided essentially only at points in the region of the crossing points on the or both electrical conductors.

7. The integrated circuit arrangement according to claim 1, characterized in that the recess or depression has an essentially rectangular cross section.

8. The integrated circuit arrangement according to claim 1, characterized in that the recess or depression has an essentially concave cross section.

9. The integrated circuit arrangement according to claim 1, characterized in that the recess or depression is filled with a nonconductive material.

10. The integrated circuit arrangement as claimed in claim 9, characterized in that the material is a varnish or a nonconductive metal, in particular the high-resistance phase of tantalum or a nonconductive natural antiferromagnet for magnetic stabilization of an artificial antiferromagnet.

11. The integrated circuit arrangement according to claim 1, characterized in that the conductivity of the region is reduced by ion bombardment or by diffusion.

12. The integrated circuit arrangement according to claim 1, characterized in that the region of the recess or depression, or the region of reduced conductivity, is provided essentially centrally or eccentrically on the electrical conductor, with respect to its width.

13. The integrated circuit arrangement according to claim 1, characterized in that recesses or depressions, or regions of reduced conductivity, are provided on the edge of the opposite side of the electrical conductor in order to reduce the conductor thickness, and are arranged offset with respect to the opposite arrangement, depression or region.

* * * * *